United States Patent [19]
Ishihara

[11] Patent Number: 4,513,266
[45] Date of Patent: Apr. 23, 1985

[54] MICROWAVE GROUND SHIELD STRUCTURE

[75] Inventor: Osamu Ishihara, Sanda, Japan

[73] Assignee: Mitsubishi Denki Kabushiki Kaisha, Japan

[21] Appl. No.: 435,116

[22] Filed: Oct. 19, 1982

[30] Foreign Application Priority Data

Nov. 28, 1981 [JP] Japan ............................ 56-193520

[51] Int. Cl.³ .............................................. H01P 3/08
[52] U.S. Cl. .................................... 333/238; 333/246
[58] Field of Search ................................ 333/238, 246

[56] References Cited

U.S. PATENT DOCUMENTS

| | | | |
|---|---|---|---|
| 2,812,501 | 11/1957 | Sommers | 333/238 |
| 3,093,805 | 6/1963 | Osifchin et al. | 333/238 X |
| 3,768,048 | 10/1973 | Jones, Jr. et al. | 333/238 |
| 3,895,435 | 7/1975 | Turner et al. | 333/238 X |

OTHER PUBLICATIONS

"A 100 ns 5 V Only 64K×1 MOS Dynamic RAM", J. Y. Chan et al, IEEE Journal Solid-State Circuits, vol. SC-15, pp. 839-846, Oct. 1980.
"A 5-V Only 16-kbit Stacked-Capacitor MOS RAM", M. Koyanagi et al, IEEE Journal, Solid State Circuits, vol. SC-15, No. 4, pp. 661-666, Aug. 1980.
"64-k RAM with Single Supply Could Be the Standard for Future Design", Sam Young, Electronic Design 13, pp. 58-64, Jun. 21, 1979.

*Primary Examiner*—Paul Gensler
*Attorney, Agent, or Firm*—Leydig, Voit, Osann, Mayer and Holt, Ltd.

[57] ABSTRACT

The invention is connected with a microwave structure, and particularly with the improvement of a microwave circuit of the three plate construction having a plurality of independent circuits formed in an inner level that is sandwiched by two dielectric conductor boards having grounded conductive layers on their outer surfaces, wherein a plurality of through holes are formed to penetrate through the dielectric boards between the neighboring circuits and extending between the conductive layers on the outer surfaces of the boards, the inner surfaces of the through holes being metallized to connect the grounded conductive layers to provide a ground shield between the neighboring circuits.

2 Claims, 7 Drawing Figures

MICROWAVE GROUND SHIELD STRUCTURE

BACKGROUND OF THE INVENTION

The present invention relates to a microwave circuit, and more specifically to the improvement in a microwave circuit having a three plate construction.

A so-called microwave plane circuit consists of a microwave circuit which is formed on a dielectric substrate. Being also called a microwave integrated circuit (MIC), the microwave circuit is recently finding extensive applications to meet the demand for constructing circuits having small size, reduced weight and a high packing density. Types of transmission lines used for the MIC can be classified into microstrip lines, coplanar lines, and three plate lines. Among the lines of these types, the microstrip lines are most widely used for the MIC's, in which a grounded conductor is formed on one surface of a dielectric substrate, and transmission circuits and other circuits are formed on the other surface. The microstrip lines have an advantage in that they can be easily formed. However, the surface on which the transmission circuit is formed, is left open and affected by the cover of a case in which it is contained. Moreover, microstrip lines have large radiation losses. The same holds true for coplanar lines. On the other hand, three-plate lines can be formed with difficulty to some extent. A three-plate line is a strip line sandwiched between two plate-line grounded conductors. In this case, however, since the transmission circuit is sandwiched by grounded conductors, radiation losses are small. Further, the transmission circuit is little affected by the cover of the case in which it is contained.

FIG. 1 is a perspective view illustrating the construction of a conventional generally employed three plate line, in which reference numerals 1 and 2 denote grounded conductors, 3 and 4 denote dielectric boards, and 5 denotes a central conductor.

FIG. 2 is a section view along the line II—II of FIG. 1. Although the central conductor 5 shown here is a single transmission line, it may be a microwave circuit of any form. Thus, with the three plate line, the electromagnetic waves do not leak since the central conductor 5 is sandwiched by the grounded conductors 1 and 2. Therefore, there is no radiation loss, and the circuit is not affected by external disturbance. Accordingly, the three plate line has small mutual interaction relative to external circuits, and is best suited for constructing MIC's.

FIG. 3 is a section view of a conventional example, which corresponds to FIG. 2, and in which two transmission lines 51 and 52 run in parallel. When a plurality of circuits are formed in the same substrate, however, mutual interaction takes place between the neighboring circuits (the mutual interaction develops not only in the three plate lines but also in the plane circuits, in general). When either one of the circuits, between which the mutual interaction is taking place, is an amplifier circuit, coupling is formed between the input portion and the output portion of the amplifier circuit via the neighboring circuit, giving rise to the occurrence of oscillation. To remove mutual interaction, it had hitherto been attempted to increase the distance between the neighboring circuits. To increase the distance among the circuits, however, inevitably results in the decrease of the integration degree of the whole MIC, which prevents the production of small sized MIC's.

SUMMARY OF THE INVENTION

In view of the above-mentioned respects, the object of the present invention is to realize a plane circuit, and especially a microwave circuit having a high degree of density, which is free of interference between the circuits formed in the inner level of a three plate construction.

BRIEF DESCRIPTION OF THE DRAWINGS

In the drawings, the same reference numerals denote the same or corresponding portions.

DESCRIPTION OF THE PREFERRED EMBODIMENTS

Figure 1:
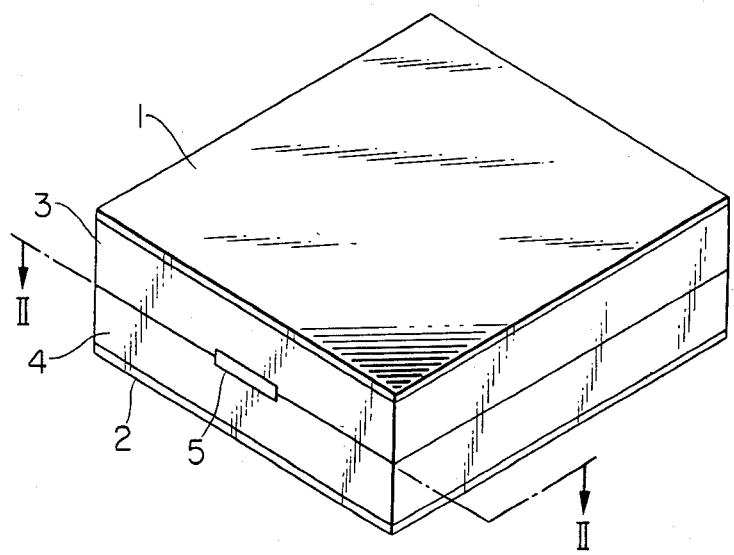
FIG. 1 is a perspective view showing the construction of a conventional generally employed three plate line.
Figure 2:
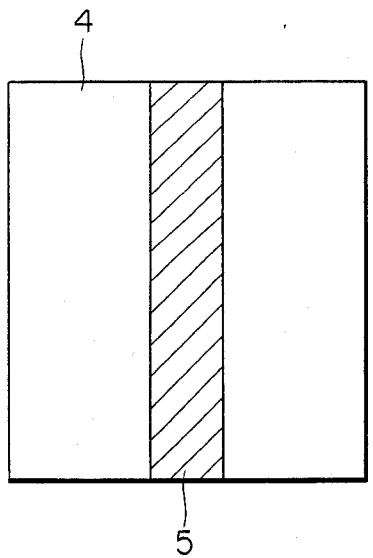
FIG. 2 is a section view along the line II—II of FIG. 1.
Figure 3:
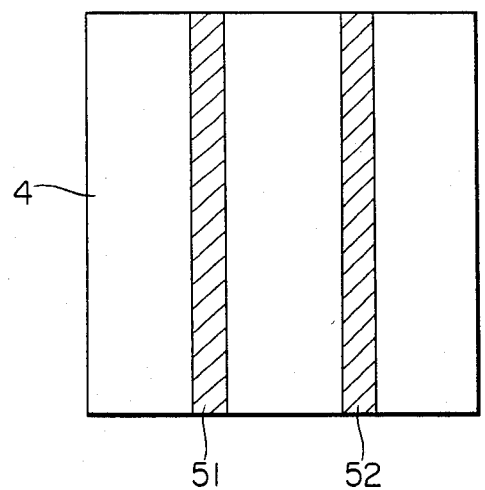
FIG. 3 is a section view which corresponds to FIG. 2 and which illustrates a conventional example in which two transmission lines are running in parallel.
Figure 4:
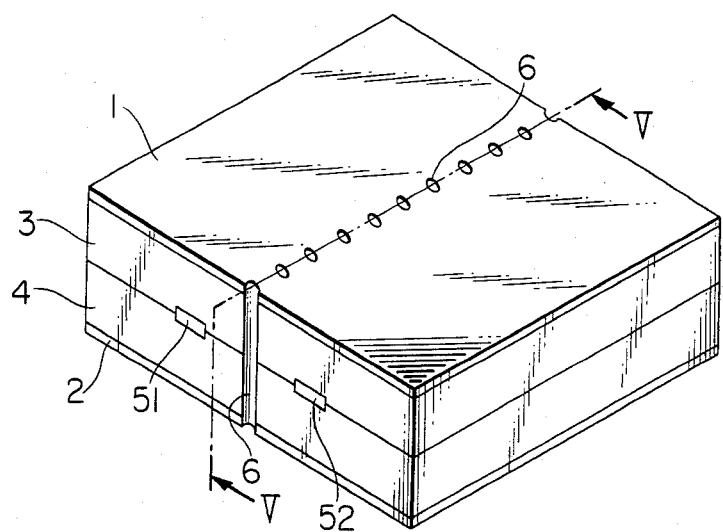
FIG. 4 is a perspective view showing an embodiment of the present invention.
Figure 5:
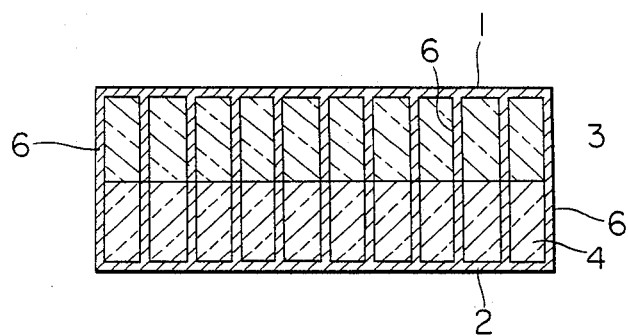
FIG. 5 is a section view along the line V—V of FIG. 4.

FIG. 4 is a perspective view showing an embodiment of the present invention, and FIG. 5 is a section view along the line V—V of FIG. 4. According to the embodiment of the invention, provision is made for a train of metallized through holes 6 that penetrate through the dielectric boards 3 and 4. Namely, the pair of outer upper and lower grounded conductive layers 1 and 2 are connected via the metallized coating on the through holes 6 to connect the grounded layers and remove mutual interaction therebetween and between the neighboring transmission lines 51 and 52 at the inner level sandwiched between the dielectric boards 3 and 4, by providing a ground shield between the circuits 51 and 52. Therefore, the circuits 51 and 52 can be formed close to each other, making it possible to reduce the size of MIC as a whole.

Figure 6:
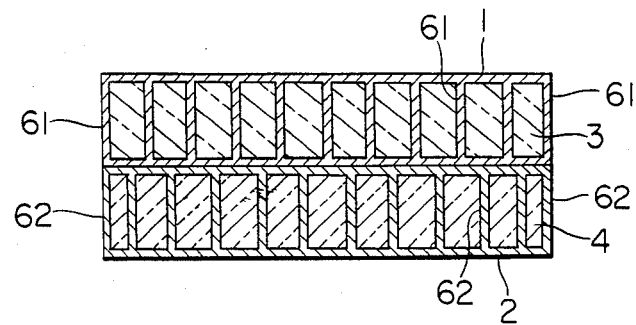
FIG. 6 is a section view which corresponds to FIG. 5 and which illustrates another embodiment of the present invention.

FIG. 6 is a sectional view showing another embodiment of the present invention, and which corresponds to FIG. 5. When the through holes 6 are formed to penetrate through the dielectric boards 3, 4 in a manner as shown in FIG. 5, the circuit may often lose mechanical strength particularly when the dielectric boards are made of quartz or ceramic material. The construction of FIG. 6 is effective for minimizing the reduction of mechanical strength. That is, according to this embodiment, through holes 61 and 62 are formed in the dielectric boards 3, 4 at positions that are offset relative to each other, and are electrically connected by a common metallized layer formed therebetween.

Although the microwave circuit described above has employed transmission lines 51, 52 only, active elements such as amplifier elements and oscillator elements may be included in the inner level, as a matter of course. Further, although the through holes 6 were arrayed in line as shown in FIG. 4, they need not, of course, be arrayed in line but, instead, required portions only of the circuits in the inner level may be surrounded by the through holes 6.

Further, the dielectric boards 3, 4 may be made of a Teflon-laminated substrate, alumina ceramics, quartz, or sapphire, which are used as substrates for MIC's.

According to the microwave circuit of three plate construction of the present invention as described in detail in the foregoing, a plurality of independent circuits are shielded from each other by a grounded shield consisting of metallized through holes. Therefore, the independent circuits can be formed in close proximity to each other, making it possible to obtain an MIC having a highly integrated form. Furthermore, with the microwave circuit of the present invention, radiation is reduced from the end surfaces of the dielectric boards, and mutual interaction relative to external circuits through the end surfaces thereof is also reduced, as compared with the conventional circuits having a three plate construction.

Figure 7:
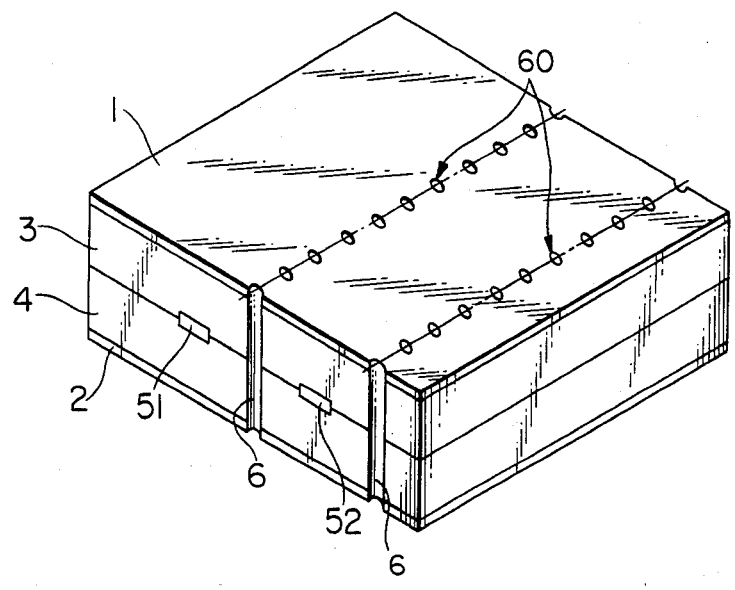
FIG. 7 is a perspective view showing an embodiment of the invention with plated through holes providing a shield around one transmission line circuit.

As shown in FIG. 7, arrays 60 of metallized holes 6 are provided around the independent circuit 52 to provide vertical ground planes by connecting the outer conductive layers.

What is claimed is:

1. In a microwave circuit of a three plate construction having a plurality of independent circuits formed in an inner level, said inner level being sandwiched between two dielectric boards with conductive layers on their outer surfaces to provide a pair of outer grounded layers, the improvement comprising:

a plurality of through holes formed in said dielectric boards between the physically neighboring circuits in said plurality of independent circuits in said inner level and extending from one of said outer conductive layers to the other, said through holes being formed in line and connected to a common electrically conductive layer at intermediate portions thereof, said through holes being formed at offset positions on the opposite sides of the common electrically conductive layer, and a metallized coating on the inner surfaces of said through holes connecting said outer conductive grounded layers and providing a ground shield between said neighboring circuits.

2. A microwave circuit according to claim 1, wherein said through holes are formed only around certain of said independent circuits in said dielectric boards.

* * * * *